United States Patent
Lin et al.

(10) Patent No.: US 10,547,345 B2
(45) Date of Patent: Jan. 28, 2020

(54) RADIO-FREQUENCY TRANSCEIVER FRONT-END CIRCUIT

(71) Applicant: National Chi Nan University, Nantou County (TW)

(72) Inventors: Yo-Sheng Lin, Taichung (TW); Xian-Xi Wang, Nantou County (TW)

(73) Assignee: NATIONAL CHI NAN UNIVERSITY, Nantou County (TW)

( * ) Notice: Subject to any disclaimer, the term of this patent is extended or adjusted under 35 U.S.C. 154(b) by 0 days.

(21) Appl. No.: 16/259,223

(22) Filed: Jan. 28, 2019

(65) Prior Publication Data

US 2019/0334572 A1 Oct. 31, 2019

Related U.S. Application Data

(62) Division of application No. 16/038,618, filed on Jul. 18, 2018.

(30) Foreign Application Priority Data

Apr. 26, 2018 (TW) .............................. 107114279 A

(51) Int. Cl.
*H04B 1/38* (2015.01)
*H04B 1/44* (2006.01)
*H03F 3/195* (2006.01)
*H04B 1/18* (2006.01)

(52) U.S. Cl.
CPC ............... *H04B 1/44* (2013.01); *H03F 3/195* (2013.01); *H04B 1/18* (2013.01); *H03F 2200/294* (2013.01); *H03F 2200/451* (2013.01)

(58) Field of Classification Search
CPC ... H04B 1/38; H04B 1/40; H04B 1/18; H04B 1/44; H04B 1/0057
See application file for complete search history.

(56) References Cited

U.S. PATENT DOCUMENTS

2010/0329165 A1* 12/2010 Matsuura .......... H04W 52/0264 370/311
2017/0104548 A1* 4/2017 Valdes Garcia ......... H04B 1/48

* cited by examiner

*Primary Examiner* — Tuan Pham
(74) *Attorney, Agent, or Firm* — Muncy, Geissler, Olds & Lowe, P.C.

(57) ABSTRACT

A radio-frequency (RF) transceiver front-end circuit includes an antenna, a power amplifier, a low-noise amplifier, a first switch unit and a second switch unit. The power amplifier is connected to a transmitting unit and the antenna to form a transmission path. The low-noise amplifier is connected to a receiving unit and the antenna to form a reception path. The transmission path and the reception path selectively do not include a λ/4 transmission line connected to the antenna. The RF transceiver front-end circuit has a receiving state and a transmitting state. In the receiving state, the first switch unit is controlled and causes the transmission path to have high impedance. In the transmitting state, the second switch unit is controlled and causes the reception path to have high impedance.

4 Claims, 6 Drawing Sheets

RADIO-FREQUENCY TRANSCEIVER FRONT-END CIRCUIT

CROSS REFERENCE TO RELATED APPLICATIONS

This application is a Divisional of co-pending application Ser. No. 16/038,618, filed on Jul. 18, 2018, for which priority is claimed under 35 U.S.C. § 120; the entire contents of all of which are hereby incorporated by reference

FIELD OF THE INVENTION

The present invention relates to a radio-frequency transceiver front-end circuit.

BACKGROUND OF THE INVENTION

Referring to FIG. 1, depicting a conventional radio-frequency (RF) transceiver front-end circuit 500 includes an antenna 50, a power amplifier 51, a low-noise amplifier 52, a first $\lambda/4$ transmission line 53, a second $\lambda/4$ transmission line 54, a first switch 55 and a second switch 56. The antenna 50 is individually connected to the first $\lambda/4$ transmission line 53 and the second $\lambda/4$ transmission line 54. The first $\lambda/4$ transmission line 53 is further connected to the power amplifier 51, and the second $\lambda/4$ transmission line 54 is further connected dot the low-noise amplifier 52. The first switch 55 is connected to the first $\lambda/4$ transmission line 53 and the power amplifier 51, and the second switch 56 is connected to the second $\lambda/4$ transmission line 54 and the low-noise amplifier 52.

As such, the conventional RF transceiver front-end circuit 500 is capable of receiving and transmitting signals through controlling the first switch 55 and the second switch 56. However, because the above conventional structure is required to transmit signals through the first $\lambda/4$ transmission line 53 and the second $\lambda/4$ transmission line 54, the RF transceiver front-end circuit 500, when designed as an integrated circuit, is limited by the volume of the first $\lambda/4$ transmission line 53 and the second $\lambda/4$ transmission line 54 and fails to be effectively miniaturized.

Further, the signal transmission process of the first $\lambda/4$ transmission line 53 and the second $\lambda/4$ transmission line 54 inevitably produces loss that disfavors applications. For example, assuming that the power amplifier 51 intends to boost the power for transmitting a signal to 0.1 W, the power is however dropped to 0.08 W when the signal is transmitted to the antenna 50 through the first $\lambda/4$ transmission line 53. Such power drop compromises the purpose of providing the power amplifier 51, and the power drop in the signal also affects whether a receiving end can reliably and stably receive the signal.

SUMMARY OF THE INVENTION

It is an object of the present invention to resolve the issues caused by transmission performed through a $\lambda/4$ transmission line required in a conventional structure.

To achieve the above object, the present invention provides a radio-frequency (RF) transceiver front-end circuit including an antenna, a power amplifier, a low-noise ampler, a first switch and a second switch. The power amplifier is connected to a transmitting unit and the antenna to form a transmission path. The low-noise amplifier is connected to a receiving unit and the antenna to form a reception path. One of the transmission path and the reception path includes a $\lambda/4$ transmission line connected to the antenna, and the other does not include the $\lambda/4$ transmission line. The power amplifier includes a first power input end, a first signal input end connected to the transmitting unit, and a first signal output end connected to the antenna. The low-noise amplifier includes a second power input end, a second signal input end connected to the antenna, and a second signal output end connected to the receiving unit. The first switch unit is provided at the first power input end or on the transmission path. When the transmission path includes the $\lambda/4$ transmission line, the first switch unit is provided on the transmission path and is connected to the first signal output end. The second switch unit is provided at the second power input end or on the reception path. When the receiving path includes the $\lambda/4$ transmission line, the second switch unit is provided on the receiving path and is connected to the second signal input end. The RF transceiver front-end circuit has a receiving state and a transmitting state. In the receiving state, the first switch unit is controlled and causes the transmission path to have high impedance. In the transmitting state, the second switch unit is controlled and causes the receiving path to have high impedance.

In one embodiment, the transmission path does not include the $\lambda/4$ transmission line; the first switch unit is provided on the transmission path and is connected to the first signal output end. The first switch unit comprises a digital switch capacitor and a switch element connected in series to the digital switch capacitor.

In one embodiment, the antenna is a dual polarization antenna.

Moreover, the present invention further provides another RF transceiver front-end circuit including an antenna, a power amplifier, a low-noise amplifier, a first switch unit and a second switch unit. The power amplifier is connected to a transmitting unit and the antenna to form a transmission path. The low-noise amplifier is connected to a receiving unit and the antenna to form a reception path. Neither the transmission path nor the reception path includes a $\lambda/4$ transmission line connected to the antenna. The power amplifier includes a first power input end, a first signal input end connected to the transmitting unit, and a first signal output end connected to the antenna. The low-noise amplifier includes a second power input end, a second signal input end connected to the antenna, and a second signal output end connected to the receiving unit. The first switch unit is provided at the first power input end or on the transmission path, and is connected to the first signal output end. The second switch unit is provided at the second power input end. The RF transceiver front-end circuit has a receiving state and a transmitting state. In the receiving state, the first switch unit is controlled and causes the transmitting path to have high impedance. In the transmitting state, the second switch unit is controlled and causes the receiving path to have high impedance.

In one embodiment, the first switch unit is provided on the transmission path and is connected to the first signal output end. The first switch unit comprises a digital switch capacitor and a switch element connected in series to the digital switch capacitor.

In one embodiment, the antenna is a dual polarization antenna.

With the above disclosure of the present invention, the present invention provides following features compared to conventional solutions. In the present invention, the RF transceiver front-end circuit may omit the provision of the $\lambda/4$ transmission line. Thus, when the RF transceiver front-end circuit is designed into an integrated circuit, the structure needed for the λ/4 transmission line is eliminated. Such that, the RF transceiver front-end circuit provides a specifically reduced volume for a designed and manufactured integrated circuit. Further, the structure shown in the present invention is capable of obtaining a high output power without sacrificing transmission efficiency.

DETAILED DESCRIPTION OF THE PREFERRED EMBODIMENTS

Figure 1:
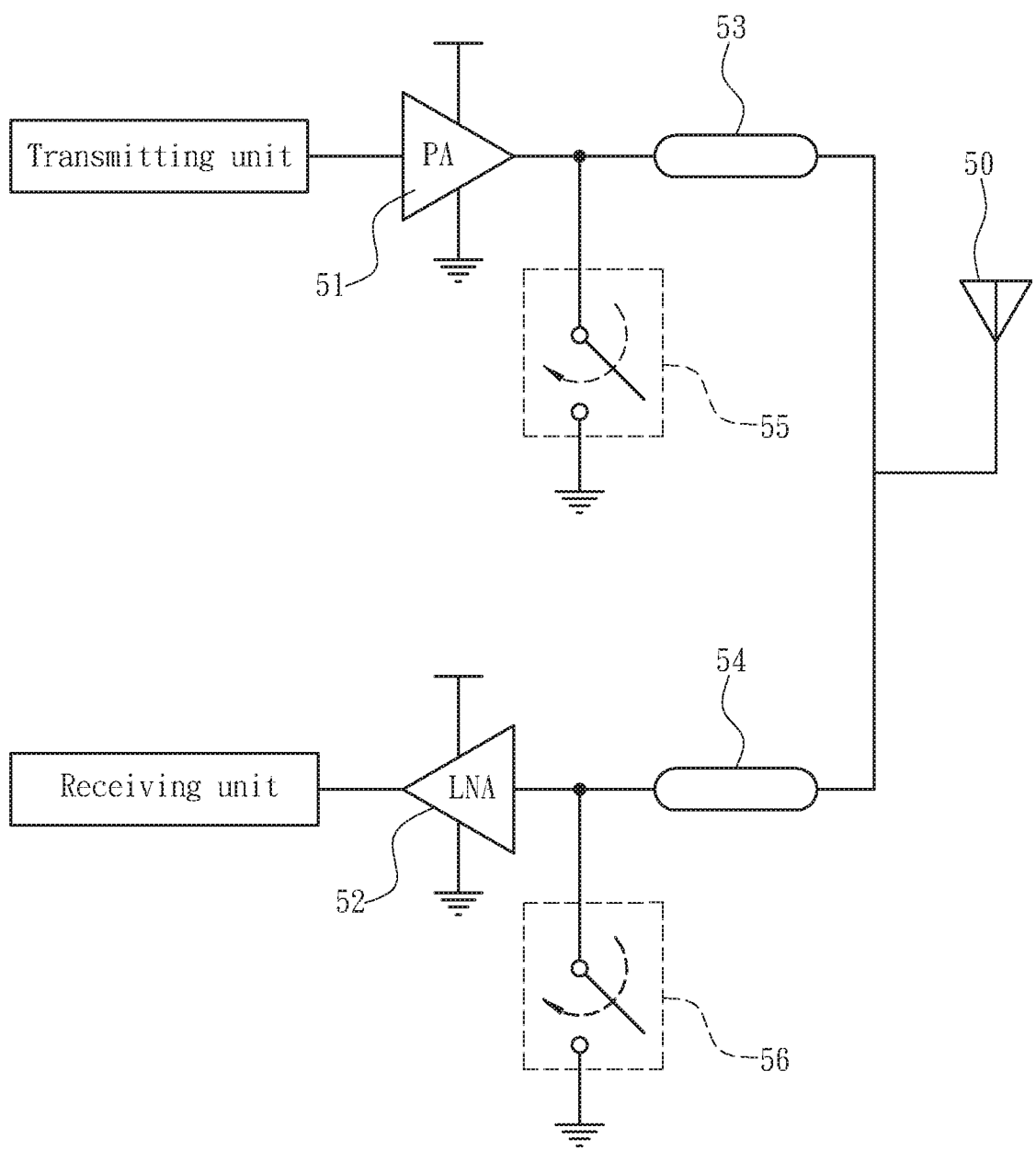
FIG. 1 is a schematic diagram of units of a conventional radio-frequency (RF) transceiver front-end circuit.
Figure 2:
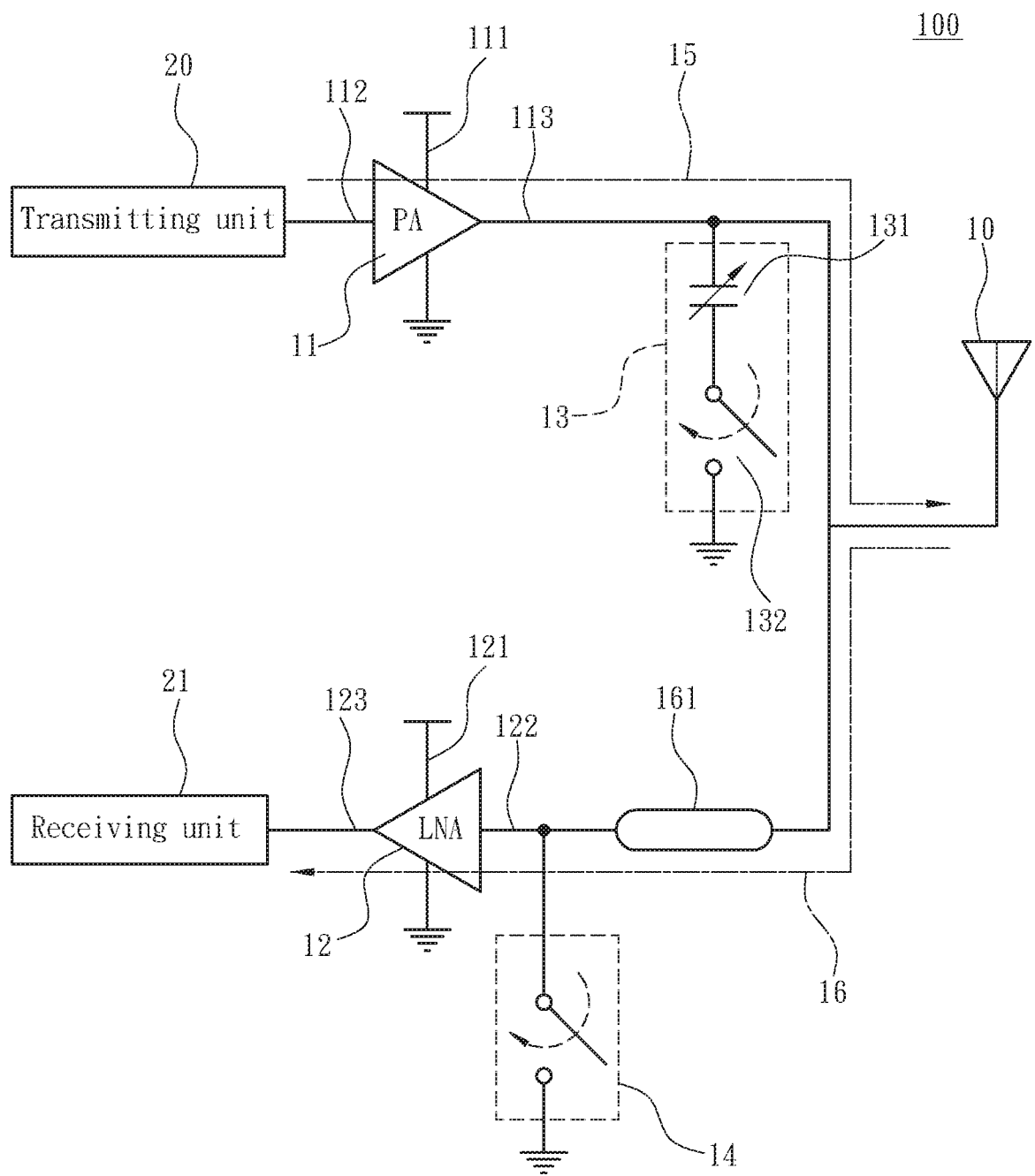
FIG. 2 is a schematic diagram of units according to a first embodiment of the present invention.

Details and technical contents of the present invention are given with the accompanying drawings below.

Referring to FIGS. 2, 3, 4, 5 and 6, the present invention provides a radio-frequency (RF) transceiver front-end circuit 100. The RF transceiver front-end circuit 100 is used as a front end of a communication apparatus for receiving or transmitting an RF signal. The RF transceiver front-end circuit 100 includes an antenna 10, a power amplifier (PA) 11, a low-noise amplifier (LNA) 12, a first switch unit 13 and a second switch unit 14. The antenna 10 may be a dual polarization antenna, wherein the term "dual polarization" may be opposite polarization (e.g., HV and VH). The power amplifier 11 is connected to the antenna 10 and a transmitting unit 20. The power amplifier 11 is operable to receive a signal from the transmitting unit 20, and output the signal to the antenna 10 after amplifying. Further, the power amplifier 11 includes a first power input end 111, a first signal input end 112 and a first signal output end 113. The first power input end 111 is connected to a power source, and acquires operating power needed by the power amplifier 11 from the power source. The first signal input end 112 is connected to the transmitting unit 20. The first signal output end 113 is connected to the antenna 10. Further, the low-noise amplifier 12 is connected to the antenna 10 and a receiving unit 21, and is operable to receive a signal from the antenna 10, amplify the signal and output the amplified signal to the receiving unit 21. Further, the low-noise amplifier 12 includes a second power input end 121, a second signal input end 122 and a second signal output end 123. The second power input end 121 is connected to a power source, and acquires operating power needed by the low-noise amplifier 12 from the power source. The second signal input end 122 is connected to the antenna 10. The second signal output end 123 is connected to the receiving unit 21.

The RF transceiver front-end circuit 100 of the present invention may define a transmission path 15 formed by the antenna 10, the power amplifier 11 and the transmitting unit 20, and a reception path 16 formed by the antenna 10, the low-noise amplifier 12 and the receiving unit 21. In one embodiment, one of the transmission path 15 and the reception path 16 includes a λ/4 transmission line 151 (or 161), and the other does not include the λ/4 transmission line 151 (or 161). In regard to the first embodiment shown in FIG. 2, when the reception path 16 includes the λ/4 transmission line 161, the transmission path 15 does not include the λ/4 transmission line 151. In regard to the third embodiment shown in FIG. 4, when the transmission path 15 includes the λ/4 transmission line 151, the reception path 16 does not include the λ/4 transmission line 161.

The first switch unit 13 of the present invention is provided at the first power input end 111 or on the transmission path 15, and the second switch unit 14 is provided at the second power input end 121 or on the reception path 16. Description is given for the first embodiment shown in FIG. 2. In this embodiment, the first switch unit 13 is provided on the transmission path 15 and is connected to the first output input end 113. Further, the first switch unit 13 includes a digital switch capacitor 131 and a switch element 132 connected in series to the digital switch capacitor 131. On the other hand, the second switch unit 14 is provided on the reception path 16 and is connected to the second signal input end 122. Further, the second switch unit 14 is provided at a back-end circuit of the λ/4 transmission line 161, and one end thereof that is not connected to the second signal input end 122 is grounded. Further, the first switch unit 13 and the second switch unit 14 are controlled by a control unit. The control unit is capable of pre-setting states of the first switch unit 13 and the second switch unit 14 according to an assuming operation to be performed by the RF transceiver front-end circuit 100. The control unit is further capable of real-time changing the states of the first switch unit 13 and the second switch unit 14 according to communication conditions of the communication apparatus.

Further, the RF transceiver front-end circuit 100 of the present invention has a receiving state and a transmitting state. In the receiving state, the first switch unit 13 is controlled and causes the transmission path 15 to have high impedance. In the transmitting state, the second switch unit 14 is controlled and causes the reception path 16 to have high impedance. Again taking the first embodiment shown in FIG. 2 for instance, when the RF transceiver front-end circuit 100 enters the receiving state, the switch element 132 in the first switch unit 13 is controlled and becomes conducted, and the digital switch capacitor 131 incorporates inductive power of a load (i.e., the antenna 10) of the power amplifier 11 into an operating frequency. Therefore, the digital switch capacitor 131 becomes resonant and open-circuit, causing the transmission path 15 to have high impedance. Accordingly, the RF signal entering from the antenna 10 is reliably transmitted to the receiving unit 21 through the reception path 16. On the other hand, when the RF transceiver front-end circuit 100 enters the transmitting state, the switch element 132 of the first switch unit 13 is not conducted, such that the transmission path 15 no longer has high impedance. Meanwhile, the second switch unit 14 is conducted and causes reception path 16 to become short-circuit. Therefore, the reception path 16 has high impedance.

Figure 3:
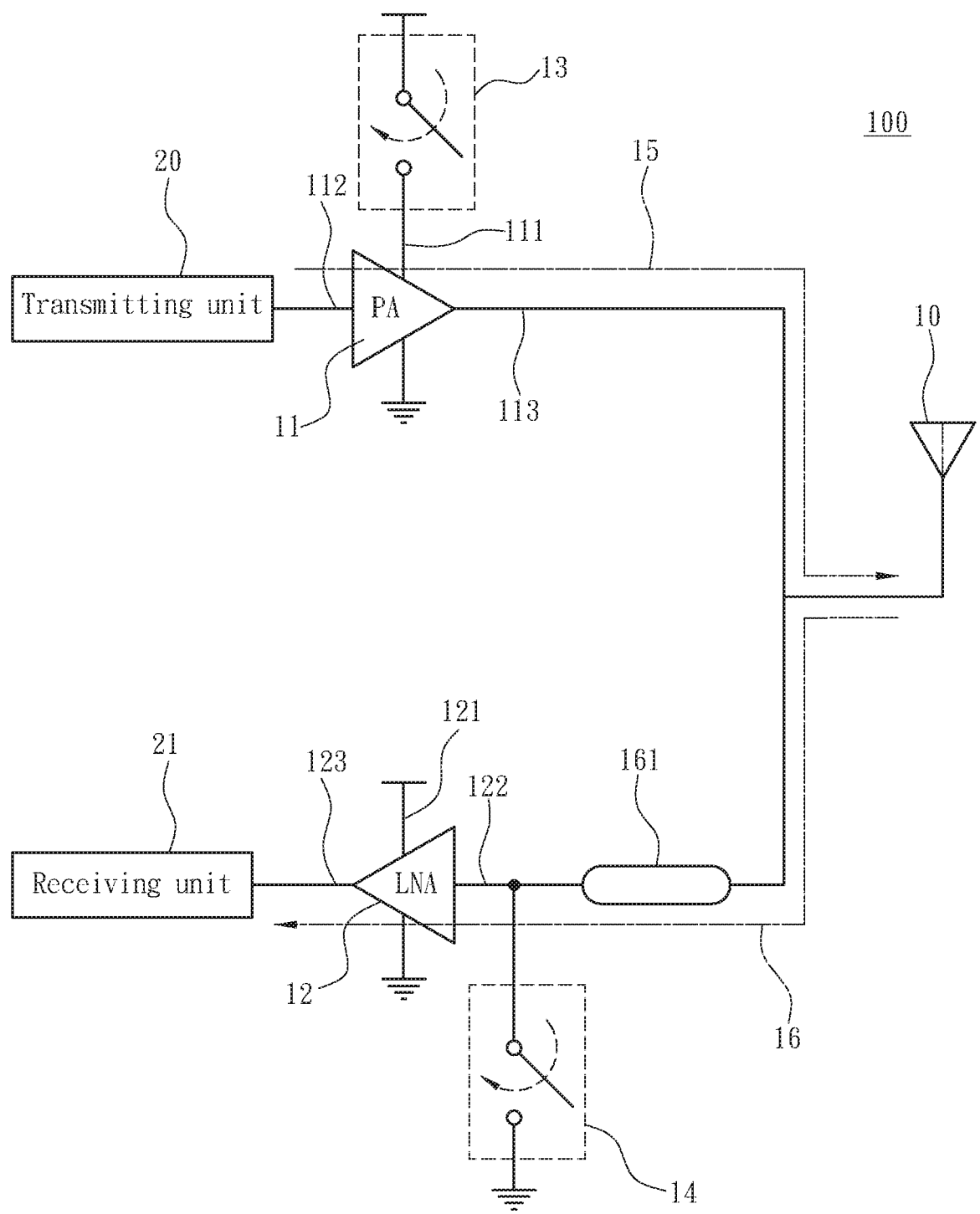
FIG. 3 is a schematic diagram of units according to a second embodiment of the present invention.

Referring to FIG. 3, in the second embodiment, the reception path 16 is also provided with the λ/4 transmission line 161, the first switch unit 13 is provided at the first power input end 111. The second switch unit 14 is provided on the reception path 16 and is connected to the second signal input end 122. In this embodiment, each of the first switch unit 13 and the second switch unit 14 may be implemented by a transistor, and actions equal to turning on and turning off may be generated by conducting or cutting off the transistor. Thus, when the RF transceiver front-end circuit 100 enters the receiving state, the first switch unit 13 is controlled to be cut off, such that the power amplifier 11 is incapable of acquiring operating power needed from the power source and causes the transmission path 15 being disconnected and has high impedance. On the other hand, when the RF transceiver front-end circuit 100 enters the transmitting state, the first switch unit 13 is controlled to be conducted, allowing the power amplifier 11 to acquire the operating power needed from the power source. The second switch unit 14 is controlled to be conducted, such that the reception path 16 becomes short-circuit and is caused to have high impedance.

Figure 4:
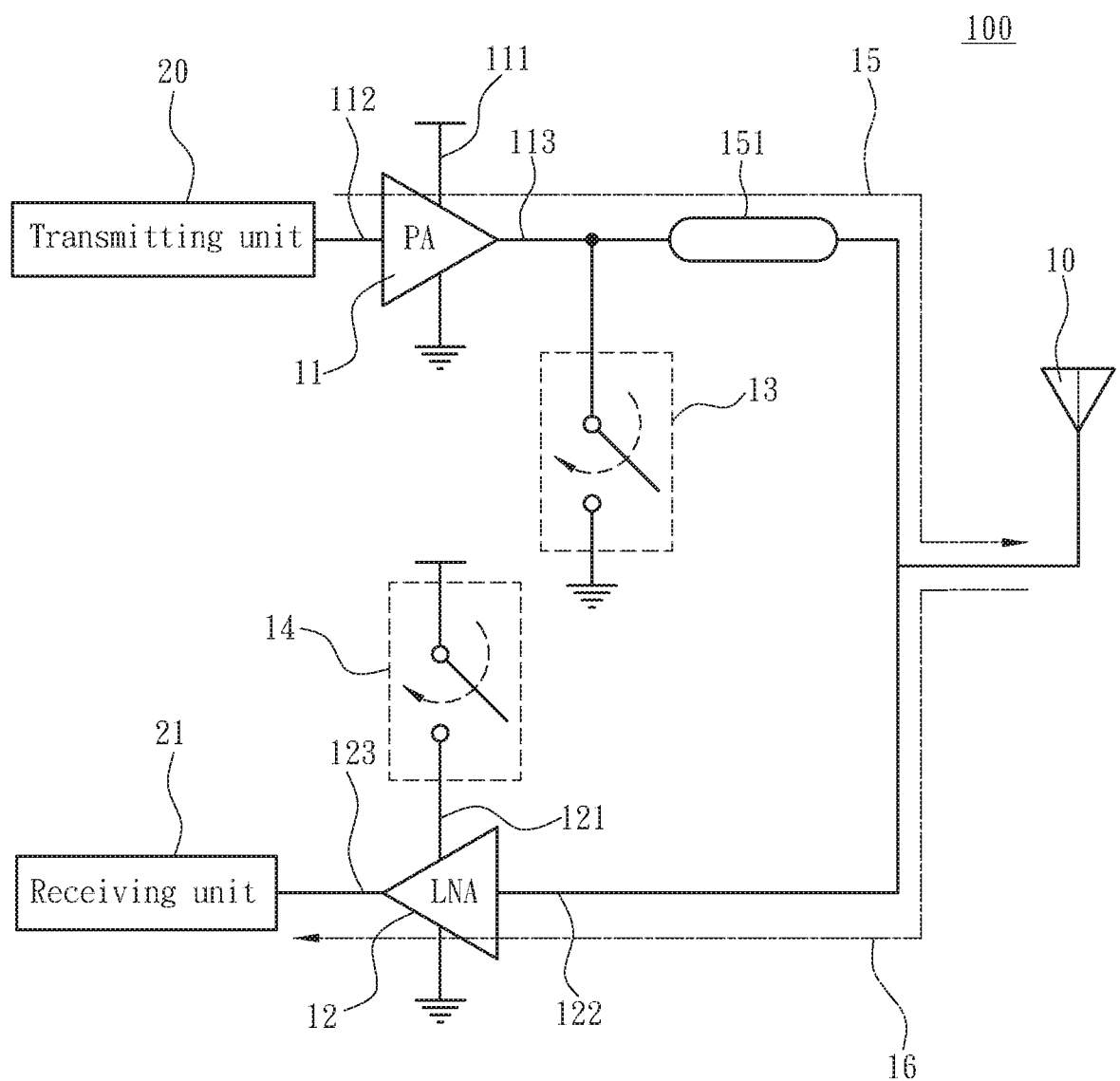
FIG. 4 is a schematic diagram of units according to a third embodiment of the present invention.

Referring to FIG. 4, in the third embodiment, the reception path 16 is not provided with the λ/4 transmission line 161, whereas the transmission path 15 is provided with the λ/4 transmission line 151. Further, the first switch unit 13 is provided on the transmission path 15 and is connected to the first signal output end 113. Besides, the second switch unit 14 is provided at the second power input end 121. In this embodiment, each of the first switch unit 13 and the second switch unit 14 may be implemented by a transistor. Further, when the RF transceiver front-end circuit 100 enters the receiving state, the first switch unit 13 is controlled to become conducted, such that the transmission path 15 becomes short-circuit and accordingly has high impedance. On the other hand, when the RF transceiver front-end circuit 100 enters the transmitting state, the first switch unit 13 and the second switch unit 14 are both controlled to be cut off, and the low-noise amplifier 12 is incapable of acquiring operating power needed from the power source, such that the reception path 16 becomes disconnected and has high impedance.

Figure 5:
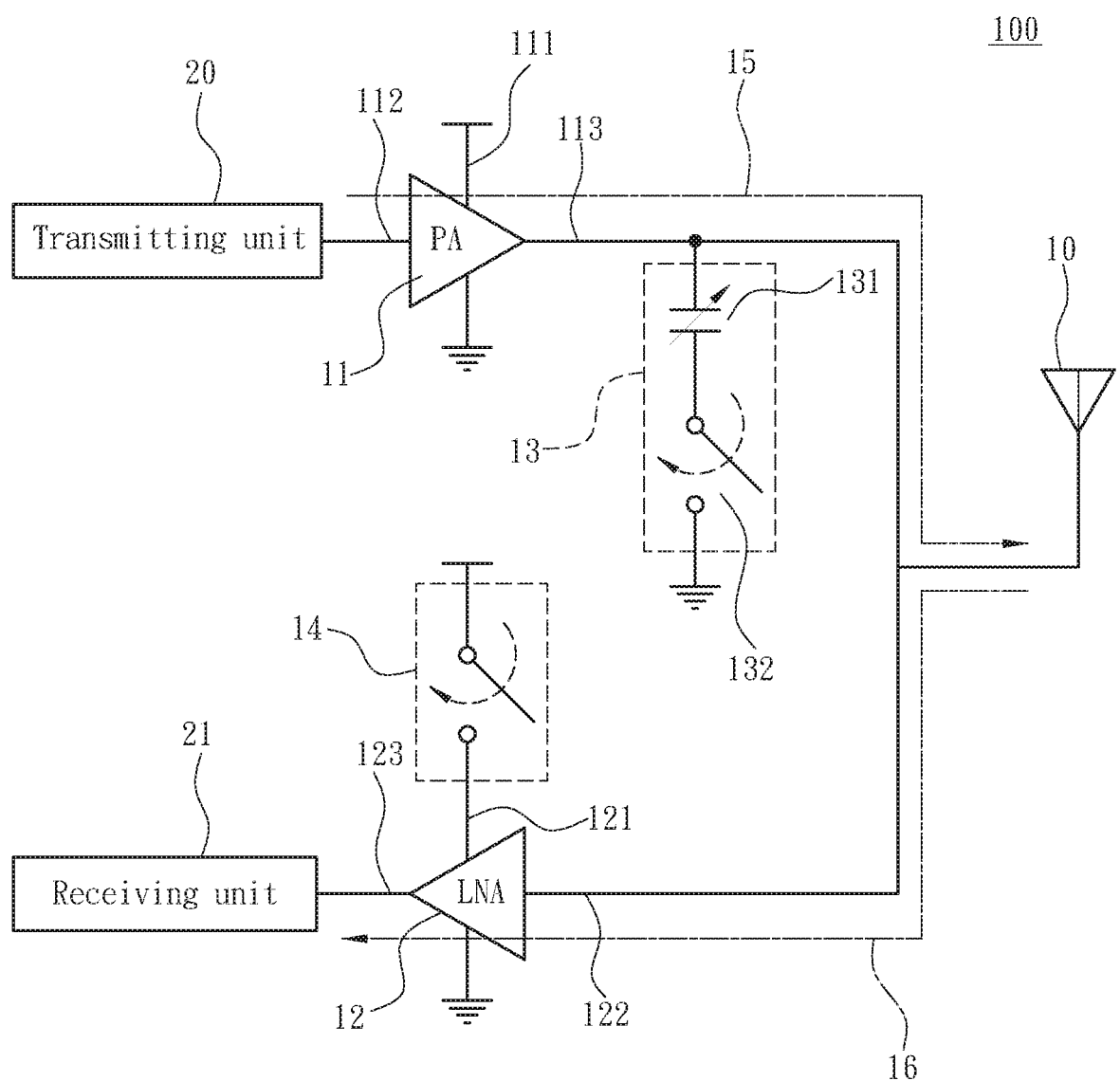
FIG. 5 is a schematic diagram of units according to a fourth embodiment of the present invention.
Figure 6:
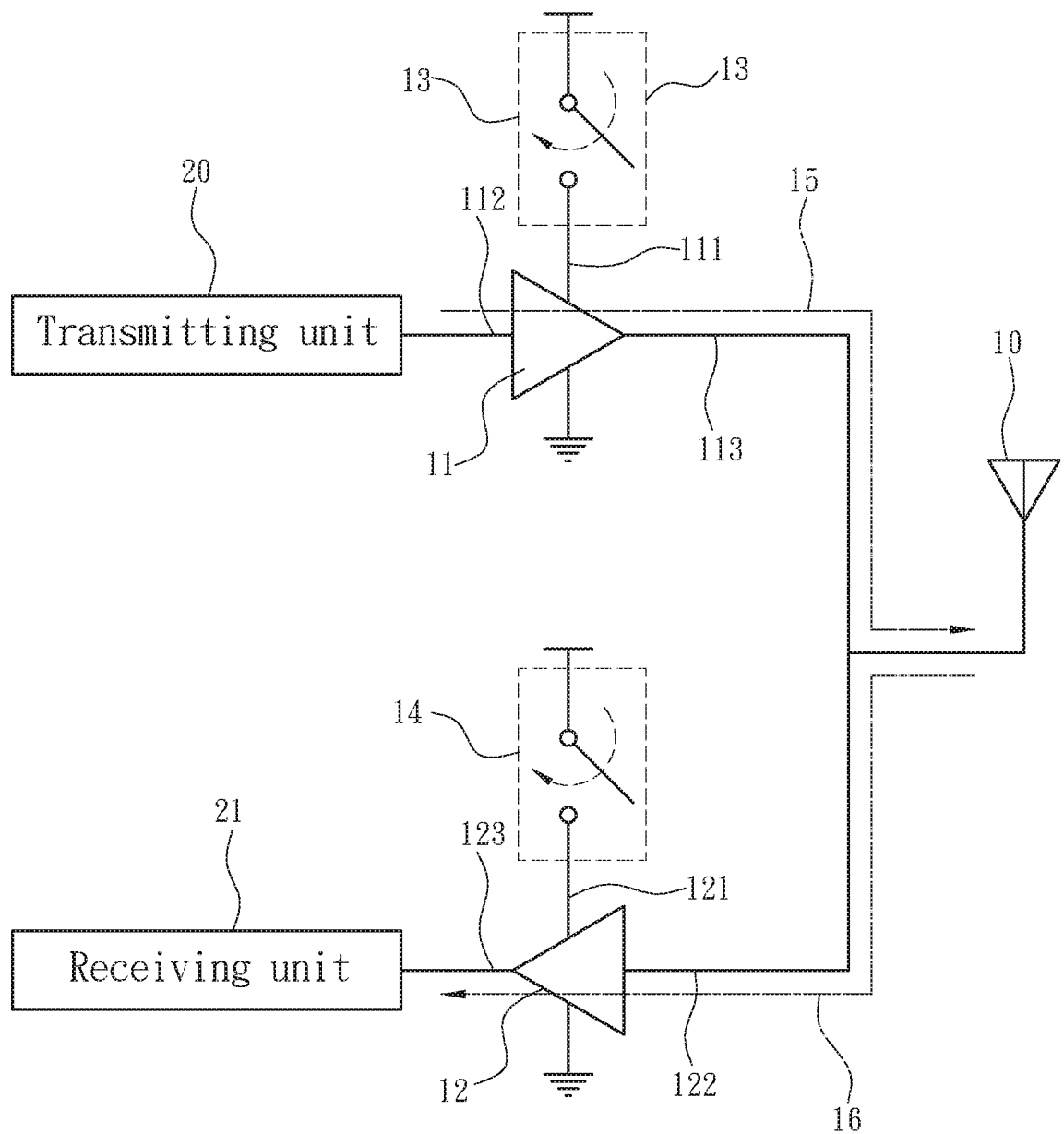
FIG. 6 is a schematic diagram of units according to a fifth embodiment of the present invention.

Referring to FIG. 5 and FIG. 6, in addition to the foregoing embodiments, in one embodiment of the present invention, neither the transmission path 15 nor the reception path 16 includes the λ/4 transmission line 151 (or 161) of the antenna 10. Referring to FIG. 5, for the fourth embodiment, the first switch unit 13 is provided on the transmission path 15 and is connected to the first signal output end 113. Further, the first switch unit 13 in this embodiment includes the digital switch capacitor 131 and the switch element 132. The second switch unit 14 is provided at the second power input end 121, and may be implemented by a transistor. As such, when the RF transceiver front-end circuit 100 enters the receiving state, the switch element 132 in the first switch unit 13 is controlled and becomes conducted, and the digital switch capacitor 131 incorporates the inductive power of a load (i.e., the antenna 10) of the power amplifier 11 into an operating frequency. Therefore, the digital switch capacitor 131 becomes resonant and open-circuit, causing the transmission path 15 to have high impedance. Meanwhile, the second switch unit 14 is also controlled and conducted, allowing the low-noise amplifier 12 to normally acquire power and operate. On the other hand, when the RF transceiver front-end circuit 100 enters the transmitting state, the first switch unit 13 is controlled and cut off, allowing a signal outputted from the transmitting unit 20 to be transmitted to the antenna 10. Furthermore, the second switch unit 14 is controlled and cut off, such that the low-noise amplifier 12 is incapable of acquiring operating power needed, and the reception path 16 accordingly becomes disconnected and have high impedance.

Referring to FIG. 6, in the fifth embodiment, the first switch unit 13 is provided at the first power input end 111, and the second switch unit 14 is provided at the second power input end 121. Further, when the RF transceiver front-end circuit 100 enters the receiving state, the first switch unit 13 is controlled and becomes cut off, and the second switch unit 14 is controlled and becomes conducted. Thus, the power amplifier 11 cannot acquire power and becomes turned off so that the transmission path 15 becomes disconnected and has high impedance. Moreover, the low-noise amplifier 12 is allowed to acquire power and operate, such that the signal received by the antenna 10 may be transmitted to the receiving unit 21 through the reception path 16. On the other hand, when the RF transceiver front-end circuit 100 enters the transmitting state, the first switch unit 13 is controlled and becomes conducted, and the second switch unit 14 is controlled and becomes cut off. Thus, the power amplifier 11 is allowed to operate normally, and the low-noise amplifier 12 is disconnected from power and stops operating, causing the reception path 16 to have high impedance.

As such, the RF transceiver front-end circuit 100 of the present invention may omit the provision of the λ/4 transmission line 151 or 161. Thus, when the RF transceiver front-end circuit 100 is designed into an integrated circuit, the structure needed for the λ/4 transmission line 151 or 161 is eliminated, providing a specifically reduced volume for the integrated circuit. Further, the structure shown in the present invention is capable of obtaining a high output power without sacrificing transmission efficiency.

What is claimed is:

1. A radio-frequency (RF) transceiver front-end circuit, comprising:
   an antenna;
   a power amplifier and a low-noise amplifier, the power amplifier connected to a transmitting unit and the antenna to form a transmission path, the low-noise amplifier connected to a receiving unit and the antenna to form a reception path, neither the transmission path nor the reception path comprises a λ/4 transmission line connected to the antenna, the power amplifier comprising a first power input end, a first signal input end connected to the transmitting unit and a first signal output end connected to the antenna, the low-noise amplifier comprising a second power input end, a second signal input end connected to the antenna and a second signal output end connected to the receiving unit;
   a first switch unit, provided at the first power input end or on the transmission path and connected to the first signal output end; and
   a second switch unit, provided at the second power input end;
   wherein the RF transceiver front-end circuit has a receiving state and a transmitting state, the first switch unit is controlled and causes the transmission path to have high impedance when the RF transceiver front-end circuit is in the receiving state, and the second switch unit is controlled and causes the reception path to have high impedance when the RF transceiver front-end circuit is in the transmitting state.

2. The RF transceiver front-end circuit of claim 1, wherein the first switch unit is provided on the transmission path and is connected to the first signal output end, and the first switch unit comprises a digital switch capacitor and a switch element connected in series to the digital switch capacitor.

3. The RF transceiver front-end circuit of claim 2, wherein the antenna is a dual polarization antenna.

4. The RF transceiver front-end circuit of claim 1, wherein the antenna is a dual polarization antenna.

* * * * *